(12) United States Patent
Suzuki et al.

(10) Patent No.: US 9,377,026 B2
(45) Date of Patent: Jun. 28, 2016

(54) ELECTRIC DEVICE INCLUDING AN ELECTRIC FAN AND A CONTROL UNIT FOR CONTROLLING THE ELECTRIC FAN

(75) Inventors: Kumiko Suzuki, Tokyo (JP); Jun Yokoyama, Tokyo (JP)

(73) Assignee: NEC Corporation, Tokyo (JP)

( * ) Notice: Subject to any disclaimer, the term of this patent is extended or adjusted under 35 U.S.C. 154(b) by 419 days.

(21) Appl. No.: 13/401,032

(22) Filed: Feb. 21, 2012

(65) Prior Publication Data

US 2012/0219399 A1 Aug. 30, 2012

(30) Foreign Application Priority Data

Feb. 25, 2011 (JP) .................................. 2011-039246

(51) Int. Cl.
| | |
|---|---|
| *F04D 25/08* | (2006.01) |
| *F04D 27/00* | (2006.01) |
| *G06F 1/20* | (2006.01) |
| *H05K 7/20* | (2006.01) |

(52) U.S. Cl.
CPC .............. *F04D 25/08* (2013.01); *F04D 27/005* (2013.01); *F04D 27/006* (2013.01); *G06F 1/206* (2013.01); *H05K 7/20836* (2013.01); *F04B 2205/10* (2013.01); *F04B 2205/11* (2013.01); *F04B 2207/03* (2013.01)

(58) Field of Classification Search
CPC ....... F04D 25/08; F04D 25/12; F04D 27/004; F04D 27/006; F04B 49/02; F04B 2205/10; F04B 2205/11; F04B 2207/03
USPC ............. 417/14, 32, 53, 63, 292; 361/679.49; 165/80.3
See application file for complete search history.

(56) References Cited

U.S. PATENT DOCUMENTS

| | | | | |
|---|---|---|---|---|
| 5,934,368 A | * | 8/1999 | Tanaka et al. ................. | 165/233 |
| 6,127,663 A | * | 10/2000 | Jones ............................ | 219/553 |
| 6,450,414 B1 | * | 9/2002 | Dartnall et al. ............... | 237/2 A |
| 7,506,190 B2 | * | 3/2009 | Thomas et al. ............... | 713/322 |
| 7,729,116 B1 | * | 6/2010 | Aybay et al. .................. | 361/695 |

(Continued)

FOREIGN PATENT DOCUMENTS

| | | |
|---|---|---|
| JP | 61-173193 U | 10/1986 |
| JP | 62-20014 A | 1/1987 |

(Continued)

OTHER PUBLICATIONS

Machine translation JPH06323583; Patent Translate, Espacenet.com, Aug. 3, 2015; 7 pages.*

(Continued)

*Primary Examiner* — Bryan Lettman
*Assistant Examiner* — Timothy P Solak
(74) *Attorney, Agent, or Firm* — McGinn IP Law Group, PLLC

(57) ABSTRACT

An electric device has a casing with an air-inlet and an air-outlet, a main unit disposed inside the casing, a first temperature sensor for detecting the temperature inside the casing, a second temperature sensor for detecting the temperature outside the casing, an electric fan, and a control unit. The control unit rotates the electric fan at the time of the low-temperature startup such that the temperature detected by the first temperature sensor is lower than a preset first threshold value, while the temperature detected by the second temperature sensor is higher than the temperature detected by the first temperature sensor.

22 Claims, 5 Drawing Sheets

(56) References Cited

U.S. PATENT DOCUMENTS

2004/0042173 A1* 3/2004 Tomioka ............... 361/687
2005/0241417 A1* 11/2005 Kay ..................... 73/864.71
2006/0169789 A1* 8/2006 Barsun et al. ........... 236/49.3

FOREIGN PATENT DOCUMENTS

| JP | 1-116716 A | 5/1989 |
| JP | H02-267439 A | 11/1990 |
| JP | H06-323583 A | 11/1994 |
| JP | H09-89309 A | 4/1997 |
| JP | H10-32656 A | 2/1998 |
| JP | 11-198498 A | 7/1999 |
| JP | 2000-276259 A | 10/2000 |
| JP | 2002-175131 A | 6/2002 |
| JP | 2004-185439 A | 7/2004 |
| JP | 2005-269699 A | 9/2005 |
| JP | 2007-19256 A | 1/2007 |
| JP | 2010-72726 A | 4/2010 |

OTHER PUBLICATIONS

Japanese Office Action dated Nov. 12, 2013, with English translation.
Japanese Office Action dated Sep. 25, 2012, with English translation.
Japanese Office Action dated Jun. 30, 2015 with a partial English translation.

* cited by examiner

ELECTRIC DEVICE INCLUDING AN ELECTRIC FAN AND A CONTROL UNIT FOR CONTROLLING THE ELECTRIC FAN

INCORPORATION BY REFERENCE

The present application claims priority from Japanese Patent Application No. 2011-39246, filed on Feb. 25, 2011 in Japan, the disclosure of which is incorporated herein by reference in its entirety.

TECHNICAL FIELD

The present invention relates to electric devices and, in particular, to a method of starting up electric devices in low-temperature environment.

BACKGROUND ART

Generally, there is a range of guaranteed operating temperature for electric devices, and it is possible that electric devices do not operate normally in environments out of the range. For example, in the case of electric devices with the guaranteed operating temperature from −5° C. to 40° C., continuous utilization in a high-temperature range over 40° C. for a long time may result in faulty or malfunction. Further, when starting up the electric devices at low-temperatures below −5° C., problems such as damage or deterioration of the components are likely to occur due to rapid change in temperature right after the startup.

Therefore, electric devices are provided with a cooling mechanism such as cooling fans and the like as a measure against high temperature. Further, as a measure against low temperature, there are electric devices equipped with a mechanism for preventing rapid temperature rise right after the startup.

For example, the electric device disclosed in the following Patent Document 1 has a cooling fan and a fan control device with a temperature sensor as the measure against high temperature. The fan control device with a temperature sensor adjusts the temperature inside the device by controlling the starting and stopping of the cooling fan according to the temperature change inside the device. Further, as the measure against low temperature, when started up at a low temperature below a predetermined startup temperature, the CPU constituting the main unit of the electric device (server devices and the like) keeps the BIOS operating state without executing the OS, and carries out a warm-up operation. During the warm-up operation, the cooling fan is stopped. During the warm-up operation, the temperature inside the device rises due to the heat emitted by the main unit of the device and, when it reaches the startup temperature, the CPU executes the OS, and subsequently executes application programs.

[Patent Document 1] JP2004-185439 A

Because the electric device disclosed in Patent Document 1 utilizes the heat emitted by the main unit of the electric device to carry out the warm-up operation, it does not need a heat source such as a heater and the like as the measure against low temperature. However, the cooling fan for the measure against high temperature is stopped during the warm-up operation. This is because it is conceivable that if the cooling fan is rotated during the warm-up operation, then the air inside the device (to be referred to as the inner air) warmed at last may be exchanged with the air outside the device (to be referred to as the outer air) so as to hinder the temperature rise inside the device. However, his phenomenon occurs when the outer air is lower in temperature than the inner air, but does not occur when the outer air is higher in temperature than the inner air. On the contrary, if the outer air is hotter than the inner air, then it is possible to facilitate temperature rise inside the electric device by introducing the outer air.

SUMMARY

Therefore, an exemplary object of the present invention is to provide an electric device to solve the problem described hereinabove, that is, the problem that the outer air is not effectively made use of at the time of startup in a low-temperature environment.

An aspect in accordance with the present invention provides an electric device having a casing with an air-inlet and an air-outlet, and a main unit disposed inside the casing, the electric device including: a first temperature sensor for detecting the temperature inside the casing; a second temperature sensor for detecting the temperature outside the casing; an electric fan; and a control unit for rotating the electric fan at the time of the low-temperature startup such that the temperature detected by the first temperature sensor is lower than a preset first threshold value, while the temperature detected by the second temperature sensor is higher than the temperature detected by the first temperature sensor.

Further, another aspect in accordance with the present invention provides an activation method to be carried out by an electric device having a casing with an air-inlet and an air-outlet, a main unit disposed inside the casing, a first temperature sensor for detecting the temperature inside the casing, a second temperature sensor for detecting the temperature outside the casing, an electric fan, and a control unit, the activation method including: rotating the electric fan by the control unit at the time of the low-temperature startup such that the temperature detected by the first temperature sensor is lower than a preset first threshold value, while the temperature detected by the second temperature sensor is higher than the temperature detected by the first temperature sensor.

Because the present invention is configured in the above manner, it is possible to facilitate temperature rise inside the electric device by effectively making use of the outer air warmer than the inner air.

EXEMPLARY EMBODIMENTS

Hereinbelow, referring to the accompanying drawings, exemplary embodiments of the present invention will be explained in detail.

A First Exemplary Embodiment

Figure 1:
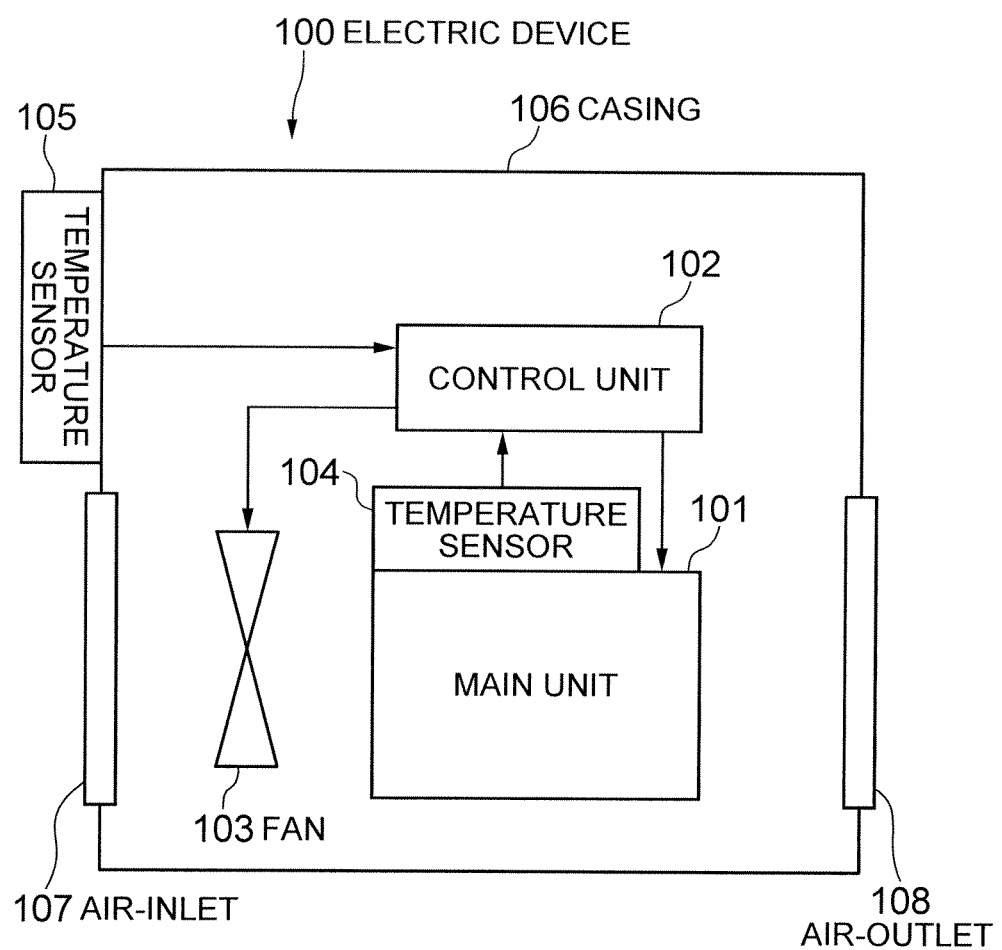
FIG. 1 is a block diagram of a first exemplary embodiment in accordance with the present invention.

Referring to FIG. 1, an electric device 100 in accordance with the first exemplary embodiment of the present invention is composed of a main unit 101, a control unit 102, a fan 103, temperature sensors 104 and 105, and a casing 106 for accommodating these components.

Mainly as a measure against high temperature for the casing 106, an air-inlet 107 for introducing the outer air into the casing and an air-outlet 108 for releasing the inner air out of the casing are provided to be opposite to each other.

The main unit 101 is the portion governing main functions of the electric device 100.

For example, if the electric device 100 is an IT device, then the computer constituting the IT device corresponds to the main unit 101. The main unit 101 is not limited to a computer, but may as well be a battery device such as a lithium battery and the like, or be configured by other devices than computers and batteries.

The fan 103 is an electric fan provided mainly as a measure against high temperature to disperse heat. However, in the first exemplary embodiment, the fan 103 is also made use of as a measure against low temperature. When started by the control unit 102, the fan 103 rotates in the direction of invoking an airflow from the air-inlet 107 toward the air-outlet 108 through the inside of the casing.

The temperature sensor 104 serves to detect the temperature inside the casing 106, that is, the inner air temperature. The temperature sensor 105 serves to detect the temperature outside the casing 106, that is, the outer air temperature. Although FIG. 1 shows that the temperature sensor 105 for detecting the outer air temperature is provided on the outside of the casing 106 in the vicinity of the air-inlet 107, it may as well be provided inside the casing 106 in the vicinity of the air-inlet 107 or air-outlet 108. The reason is that the vicinity of the air-inlet or air-outlet receives the influence of outer air.

The control unit 102 is electrically connected to the fan 103, the temperature sensors 104 and 105, and the main unit 101 through signal lines. The control unit 102 has a function to control the temperature measuring by the temperature sensors 104 and 105, the starting and stopping of the fan 103, the starting and stopping of the main unit 10 and the like.

Next, the operation of the first exemplary embodiment will be explained.

When the electric device 100 is started by pressing an unshown start button, etc., the control unit 102 determines whether or not the inner air temperature of the device detected by the temperature sensor 104 is lower than a preset first threshold value. If the inner air temperature is not lower than the first threshold value, then the control unit 102 determines the low-temperature control to be unnecessary, and immediately starts up the main unit 101. If the main unit 101 is a computer including a CPU, for example, the control unit 102 starts up the main unit 101 by causing the CPU to execute the OS.

On the other hand, if the inner air temperature is lower than the first threshold value, then the control unit 102 carries out the low-temperature control. First, the control unit 102 determines whether or not the outer air temperature detected by the temperature sensor 105 is higher than the inner air temperature detected by the temperature sensor 104. Next, if the outer air temperature is higher than the inner air temperature, then the control unit 102 rotates the fan 103. By virtue of introducing the outer air warmer than the inner air from the air-inlet 107 into the casing 106, the temperature of the main unit 101 rises gradually. Thereafter, if either the temperature on the temperature sensor 104 comes to be equal to or higher than the first threshold value or a predetermined condition is established such as a certain time elapses and the like, then the control unit 102 starts up the main unit 101. Further, the control unit 102 adjusts the temperature inside the device by controlling the starting and stopping of the fan 103 according to the temperature change inside the device during the ordinary operation of the electric device 100. For example, if the temperature detected by the temperature sensor 104 is higher than a second high-temperature threshold value equal to or higher than the Drat threshold value, then the control unit 102 rotates the fan 103.

At the start time of the low-temperature control, the operation of the control unit 102 may be arbitrary when the outer air temperature is not higher than the inner air temperature. For example, if there is some other unit for raising the temperature of the main unit 101, then the main unit 101 may wait to be started until that unit raises the temperature of the main unit 101 to higher than the first threshold value. Alternatively, if there is no other unit like that, then the control unit 102 may either not start up the main unit 101 or venture to start up the main unit 101 even at a low temperature.

In this manner, according to the first exemplary embodiment, at the time of starting up the device at low temperatures, it is possible to facilitate temperature rise inside the electric device by utilizing the outer air with a higher temperature than the inner air.

Further, according to the first exemplary embodiment, it is possible to make use of the fan 103 utilized originally in heat dispersion for the measure against low temperatures without any physical modification.

A Second Exemplary Embodiment

Figure 2:
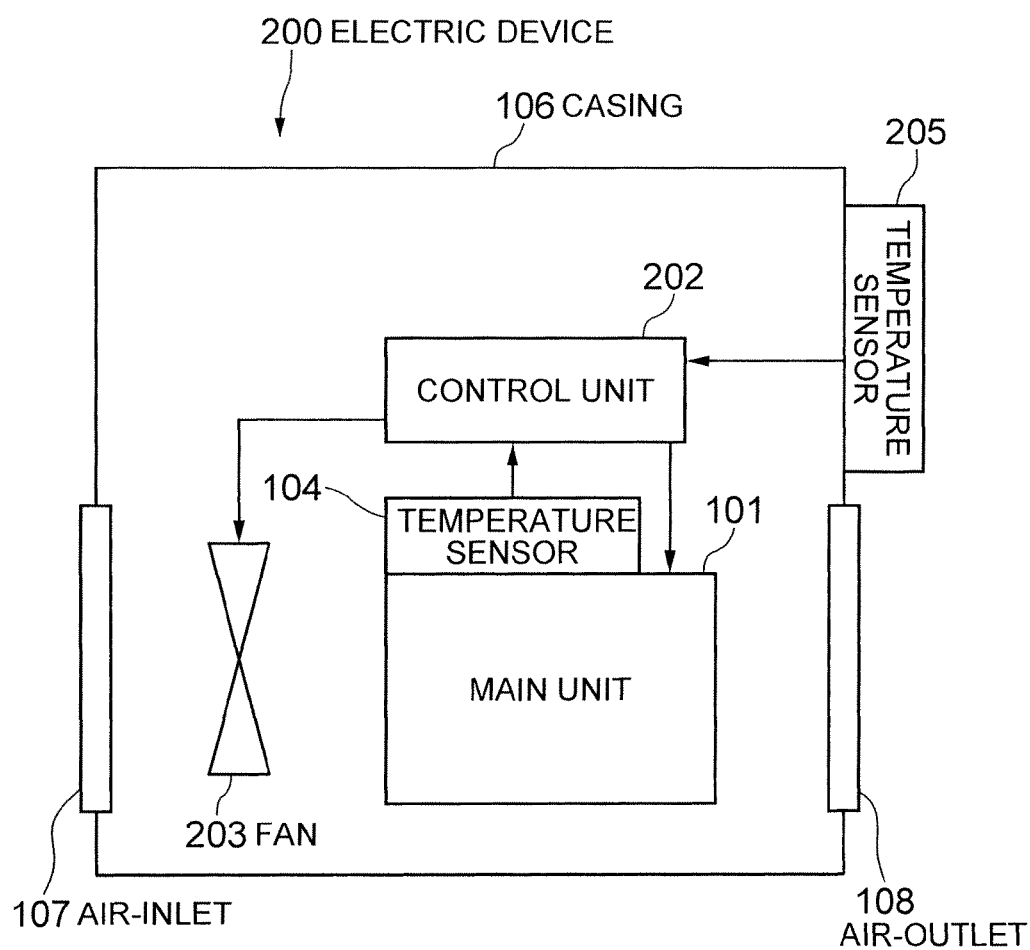
FIG. 2 is a block diagram of a second exemplary embodiment in accordance with the present invention.

Referring to FIG. 2, compared with the electric device 100 in accordance with the first exemplary embodiment shown in FIG. 1, an electric device 200 in accordance with a second exemplary embodiment of the present invention is different in the aspect of having a control unit 202, a fan 203, and a temperature sensor 205 instead of the control unit 102, the fan 103, and the temperature sensor 105.

The temperature sensor 205 serves to detect the outer air temperature in the vicinity of the air-outlet 108 of the casing 106. Although FIG. 2 shows that the temperature sensor 205 is provided on the outside of the casing 106, it may as well be provided inside the casing 106 in the vicinity of the air-outlet 108. The reason is that the vicinity of the air-outlet 108 receives the influence of outer air.

The fan 203 is an electric fan provided mainly as a measure against high temperature to disperse heat. However, in the second exemplary embodiment, the fan 203 is also made use of as a measure against low temperature. The fan 203 can rotate in the direction of invoking an airflow from the air-inlet 107 toward the air-outlet 108 through the inside of the casing as well as in the opposite direction. Hereinbelow, the former will be referred to as the positive rotation, whereas the latter will be referred to as the negative or inverse rotation.

The control unit 202 is electrically connected to the fan 203, the temperature sensors 104 and 205, and the main unit 101 through signal lines. The control unit 202 has a function to control the temperature measuring by the temperature sensors 104 and 205, the starting, stopping and rotation direction of the fan 203, the starting and stopping of the main unit 101, and the like.

Next, the operation of the second exemplary embodiment will be explained mainly with a focus on the different aspects from the first exemplary embodiment.

When the electric device 200 is started by pressing an unshown start button, etc., the control unit 202 determines whether or not the inner air temperature of the device detected by the temperature sensor 104 is lower than a preset first threshold value. If the inner air temperature is not lower than the first threshold value, then the control unit 202 determines the low-temperature control to be unnecessary, and immediately starts up the main unit 101.

On the other hand, if the inner air temperature is lower than the first threshold value, then the control unit 202 carries out the low-temperature control. First, the control unit 202 determines whether or not the outer air temperature detected by the temperature sensor 205 is higher than the inner air temperature detected by the temperature sensor 104. Next, if the outer air temperature is higher than the inner air temperature, then the control unit 202 inversely rotates the fan 203. By virtue of introducing the outer air warmer than the inner air from the air-outlet 108 into the casing 106, the temperature of the main unit 101 rises gradually. Thereafter, if either the temperature on the temperature sensor 104 comes to be equal to or higher than the first threshold value or a predetermined condition is established such as a certain time elapses and the like, then the control unit 202 starts up the main unit 101. Further, the control unit 202 adjusts the temperature inside the device by controlling the starting and stopping of the positive rotation of the fan 203 according to the temperature change inside the device during the ordinary operation of the electric device 200. For example, if the temperature detected by the temperature sensor 104 is higher than a second high-temperature threshold value equal to or higher than the first threshold value, then the control unit 202 positively rotates the fan 203.

At the start time of the low-temperature control, in the same manner as the control unit 102 in the first exemplary embodiment, the operation of the control unit 202 may be arbitrary when the outer air temperature is not higher than the inner air temperature.

In this manner, according to the second exemplary embodiment, at the time of starting up the device at low temperatures, it is possible to facilitate temperature rise inside the electric device by utilizing the outer air with a higher temperature than the inner air. In particular, the second exemplary embodiment exerts its effect especially on the case of utilizing a plurality of electric device 200 in the same place. The reason is as follows.

In cases of setting up the electric device 200 together with other similar electric devices, their air-outlets generally face in the same direction. For example, in the case of aligning a plurality of electric devices in a row along the wall surface in a room, their air-outlets often face the wall side. Therefore, when some of the electric devices are in operation, because the exhaust heat of those electric devices in operation is released to the air-outlet side, the temperature on the air-outlet side tends to become higher in comparison with the air-inlet side. In the second exemplary embodiment, because of inversely rotating the fan 203, it is possible to warm up the main unit 101 by utilizing the outer air on the air-outlet side with a higher temperature than the air-inlet side.

A Third Exemplary Embodiment

Figure 3:
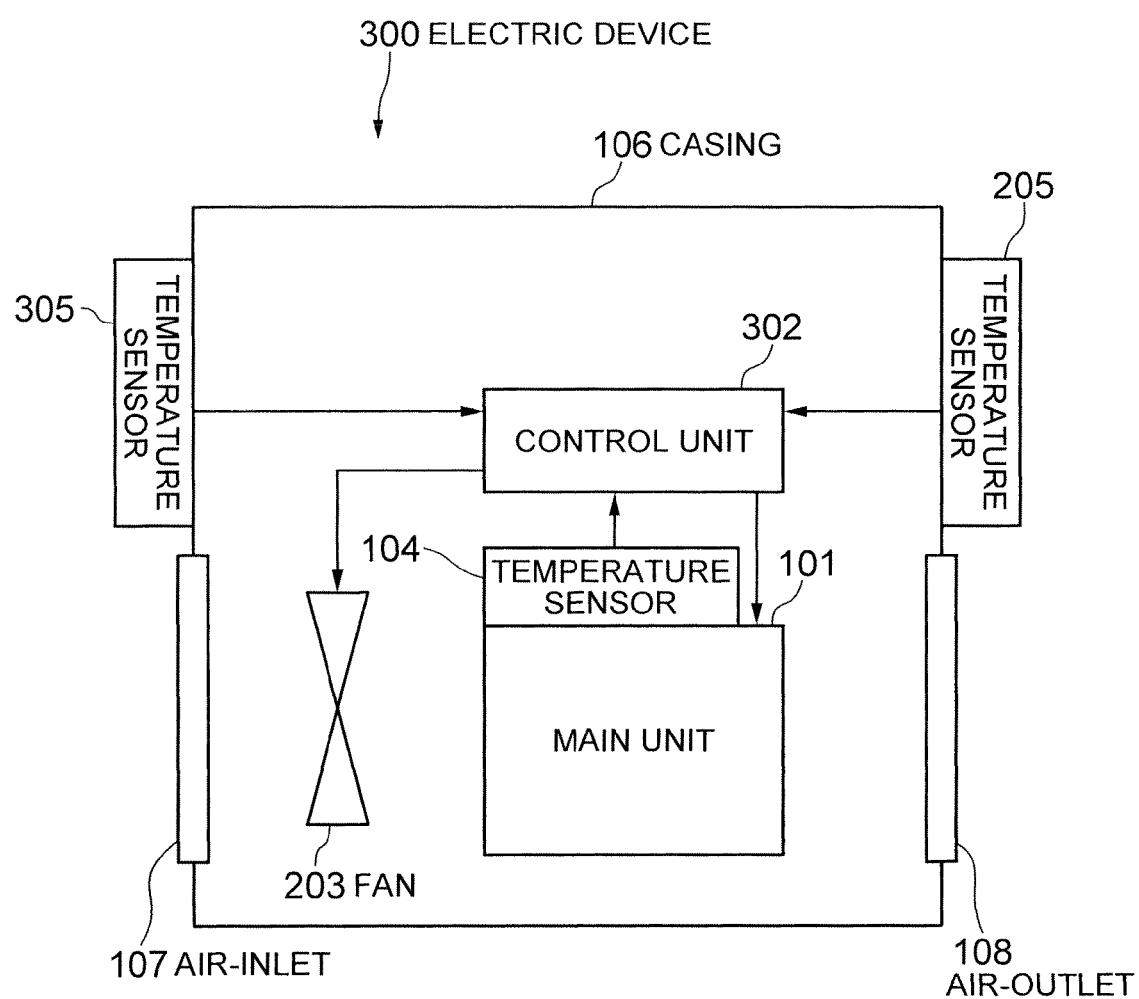
FIG. 3 is a block diagram of a third exemplary embodiment in accordance with the present invention.

Referring to FIG. 3, compared with the electric device 200 in accordance with the second exemplary embodiment shown in FIG. 2, an electric device 300 in accordance with a third exemplary embodiment of the present invention is different in the aspect of adding a temperature sensor 305, and having a control unit 302 instead of the control unit 202.

Similar to the temperature sensor 105 of the first exemplary embodiment in FIG. 1, the temperature sensor 305 serves to detect the outer air temperature in the vicinity of the air-inlet 107 of the casing 106. Although FIG. 3 shows that the temperature sensor 305 is provided on the outside of the casing 106, it may as well be provided inside the casing 106 in the vicinity of the air-inlet 107.

The control unit 302 is electrically connected to the fan 203, the temperature sensors 104, 205 and 305, and the main unit 101 through signal lines. The control unit 302 has a function to control the temperature measuring by the temperature sensors 104, 205 and 305, the starting, stopping and rotation direction of the fan 203, the starting and stopping of the main unit 101, and the like.

Next, the operation of the third exemplary embodiment will be explained mainly with a focus on the different aspects from the first and second exemplary embodiments.

When the electric device 300 is started by pressing an unshown start button, etc., the control unit 302 determines whether or not the inner air temperature of the device detected by the temperature sensor 104 is lower than a preset first threshold value. If the inner air temperature is not lower than the first threshold value, then the control unit 302 determines the low-temperature control to be unnecessary, and immediately starts up the main unit 101.

On the other hand, if the inner air temperature is lower than the first threshold value, then the control unit 302 carries out the low-temperature control. First, the control unit 302 compares the outer air temperature on the air-outlet side detected by the temperature sensor 205 with the outer air temperature on the air-inlet side detected by the temperature sensor 305, and selects the higher one. Next, the control unit 302 determines whether or not the selected outer air temperature is higher than the inner air temperature of the device detected by the temperature sensor 104. Then, if the selected outer air temperature is higher than the inner air temperature, then the control unit 302 rotates the fan 203 to introduce the outer air into the casing 106, warming up the main unit 101 with the outer air warmer than the inner air. At this time, if the outer air on the air-outlet side is selected, then the control unit 302 inversely rotates the fan 203 to introduce the outer air from the air-outlet 108 into the casing 106. On the other hand, if the outer air on the air-inlet side is selected, then the control unit 302 positively rotates the fan 203 to introduce the outer air from the air-inlet 107 into the casing 106. Thereafter, if either the temperature on the temperature sensor 104 comes to be equal to or higher than the first threshold value or a predetermined condition is established such as a certain time elapses and the like, then the control unit 302 starts up the main unit 101. Further, the control unit 302 adjusts the temperature inside the device by controlling the starting and stopping of the positive rotation of the fan 203 according to the temperature change inside the device during the ordinary operation of the electric device 300.

At the start time of the low-temperature control, in the same manner as the control units 102 and 202 in the first and second exemplary embodiments, the operation of the control unit 302 may be arbitrary when the selected outer air temperature is not higher than the inner air temperature.

In this manner, according to the third exemplary embodiment, at the time of starting up the device at low temperatures, it is possible to facilitate temperature rise inside the electric device by utilizing the outer air with a higher temperature than the inner air. In particular, the third exemplary embodiment is capable of selectively introducing the outer air with a higher temperature from the air-inlet side and the air-outlet side.

A Fourth Exemplary Embodiment

Outline

One of the characteristics of the fourth exemplary embodiment lies in gradually raising the temperature inside a computer being activated if the temperature inside the computer is lower than the guaranteed operating temperature, and starting the OS after controlling the temperature into a safe state as the operating temperature for the computer. Further, another characteristic of the fourth exemplary embodiment is that a higher versatility is available because it is possible to realize it almost without changing the structure of an ordinary computer.

Explanation of the Configuration

Figure 4:
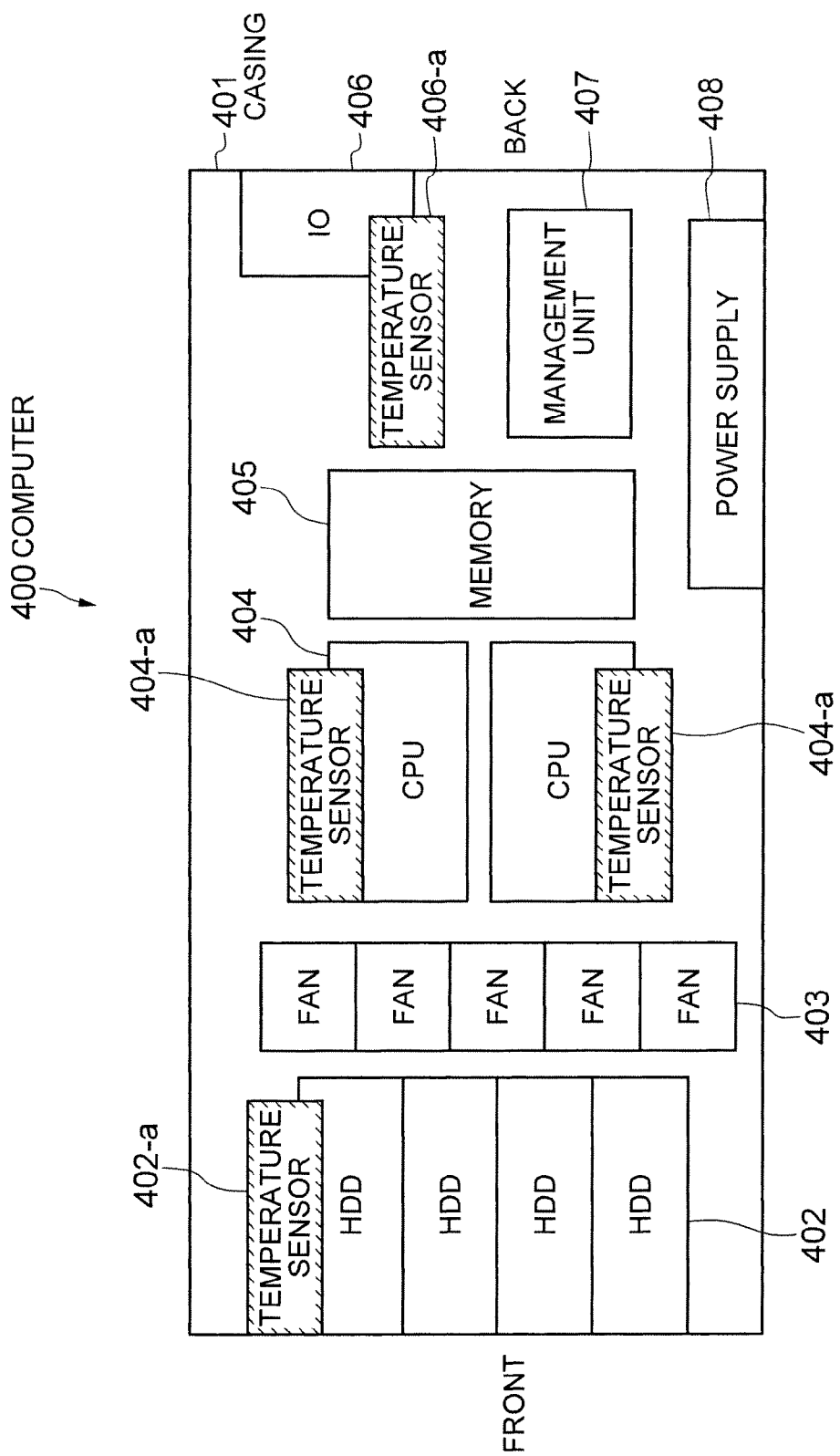
FIG. 4 is a block diagram of a fourth exemplary embodiment in accordance with the present invention.

Referring to FIG. 4, a computer 400 in accordance with the fourth exemplary embodiment is constituted by an HDD 402 (Hard Disk Drive), a temperature sensor 402-a installed in the vicinity of the HDD, a fan 403 capable of positive and inverse rotations, a CPU 404, a temperature sensor 404-a installed in the vicinity of the CPU, a memory 405, an IO 406 (Input Output unit), a temperature sensor 406-a installed in the vicinity of the 10, a management unit 407, a power supply 408, and a casing 401 for accommodating the above components. The casing 401 is provided with an air-inlet (not shown) on the front side, and an air-outlet (not shown) on the back side. Although FIG. 4 shows two CPUs, five fans, four HDDs, one memory, one 10, and one power supply, the number of these components is arbitrary. Further, the arrangement of each component in the casing 401 is not limited to that shown in the figure either.

Figure 5:
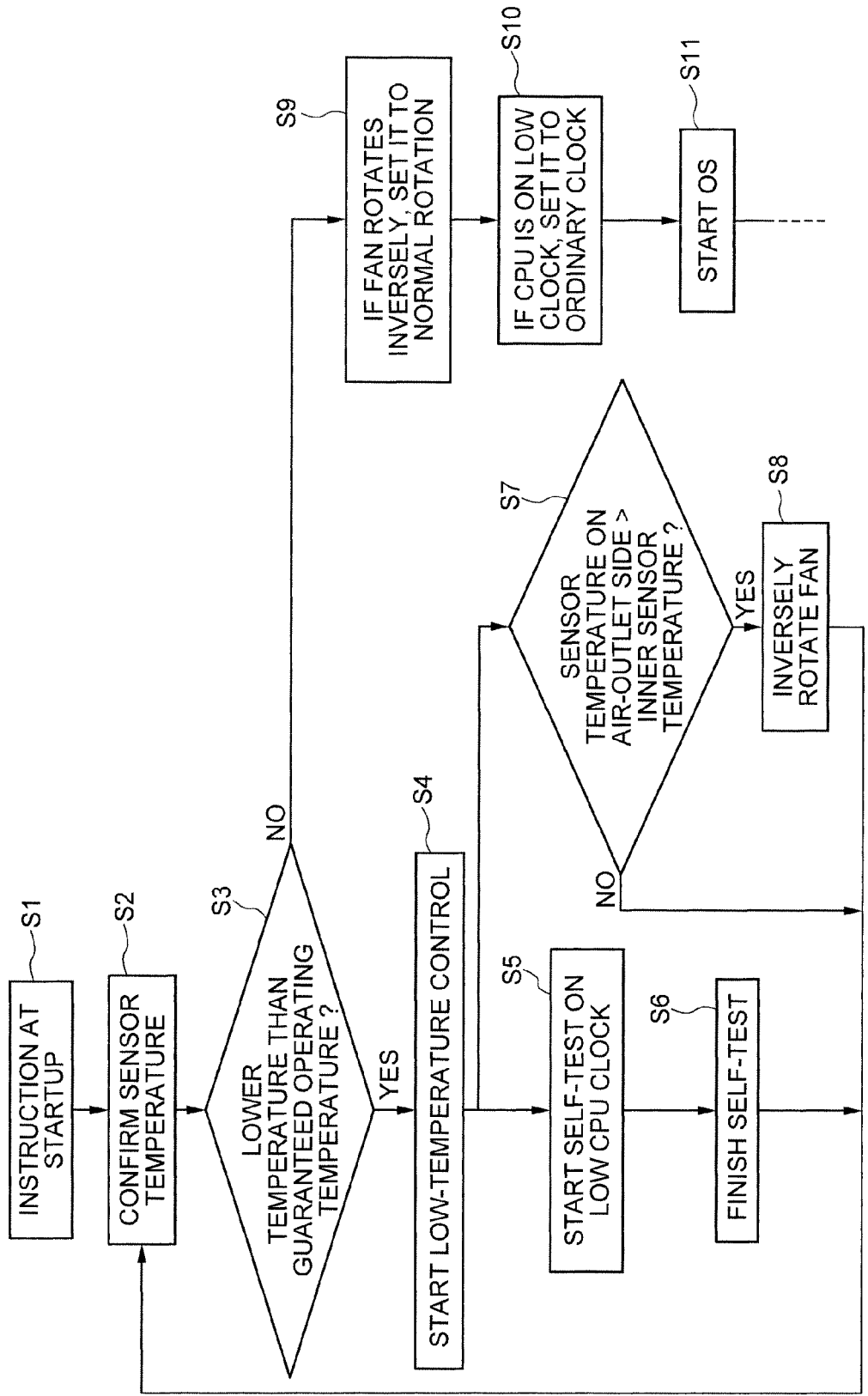
FIG. 5 shows a control flow in the fourth exemplary embodiment in accordance with the present invention.

The management unit 407 corresponds to the control units 102, 202 and 302 in the first to third exemplary embodiments, respectively. The management unit 407 is electrically connected to the other components such as the temperature sensor 402-a, temperature sensor 404-a, temperature sensor 406-a, fan 403, CPU 404, CPU 404, and the like through unshown signal lines. The management unit 407 has a microprocessor (not shown), and is programmed to carry out the control flow shown in FIG. 5.

Explanation of the Operation

When a user and the like issues an instruction to start up the computer 400 (step S1), the management unit 407 confirms the temperature detected by each of the temperature sensors 402-a, 404-a and 406-a installed inside the computer (step S2). Then, the management unit 407 determines whether or not the temperature detected by any one of the temperature sensors is lower than the guaranteed operating temperature prestored in the memory of the management unit 407 (step S3).

If the temperature detected by any one of the temperature sensors is lower than the guaranteed operating temperature (Yes at step S3), then the management unit 407 starts the low-temperature control (step S4). Under the low-temperature control, first, the management unit 407 operates the CPU (processor) on a clock with a lower frequency than usual to start a self-test operation (a startup diagnostic program implemented generally in starting the computer; step S5).

In addition, the management unit 407 determines whether or not the temperature of the computer on the air-outlet side (the temperature detected by the temperature sensor 406-a) is higher than the temperature of the computer on the central or air-inlet side (the temperature detected by the temperature sensor 404-a or temperature sensor 402-a; step S7). Then, if the temperature on the air-outlet side is higher than the temperature on the central or air-inlet side (Yes at step S7), then the management unit 407 inversely rotates the fan 403 to take in the outer air (step S8). By virtue of this, the air on the air-outlet side is taken into the computer. Since a computer generally intakes air from the front and discharges air at the back, when other devices in operation are mounted on the rack (cabinet) on which a starting-up computer is also mounted, the exhaust heat is released to the back side (the air-outlet side). In this manner, the fourth exemplary embodiment makes use of the possibility of a high temperature on the air-outlet side.

As the computer completes the self-test (step S6), the management unit 407 confirms again the temperature detected by each temperature sensor (step S2), and compares the same with the guaranteed operating temperature (step S3). If the comparison result shows it still lower than the guaranteed operating temperature as before, then the self-test is carried out over again (step S5). By virtue of this, with the heat emitted by the components installed in the computer, the temperature of the entire computer rises gradually.

If the temperature detected by each temperature sensor is higher than the guaranteed operating temperature (No at step S3), then the management unit 407 shifts the process to the ordinary OS startup. At the time, if the fan 403 is set at the inverse rotation in the control process at low temperatures, then the management unit 407 returns the setting to the positive rotation (step S9). Further, if the clock frequency of the CPU is at the low level, then the management unit 407 changes it to the ordinary high clock frequency (step S10). Then, the management unit 407 activates the OS on the CPU and, subsequently, activates the application programs (step S11).

Explanation of the Effect

According to the fourth exemplary embodiment, it is possible to facilitate temperature rise of the device at low temperatures in a safer manner to carry out the process up to the OS activation by the computer itself without changing the computer structure. Because it is not necessary to provide special equipment such as heaters and the like, extra equipment cost does not arise.

Conventionally, it is common to let a computer operate successively. However, due to the recent-year movements of the ecological activities, $CO_2$ reduction and the like, the environment for operating and installing computers is experiencing a great change such as shutting down computers at night, introducing the outer air throughout the year, leaving out air-conditioning equipment, and the like. Conceivably, such trend will pick up even more in the days to come, and the need to operate computers from the state of low temperatures will increase more and more. According to the fourth exemplary embodiment, in answer to such need, it is possible to operate computers safely in a low-temperature environment and provide a low-cost method for realizing the purpose.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims. Further, the present invention can realize the necessary functions not only on hardware as a matter of course, but with computers and a program as well. The program is provided in the form of being recorded in a computer-readable recording medium such as magnetic disks, semiconductor memories, and the like, and is read out by a computer at the time of starting the computer and the like to make the computer function as the control unit 102, 202, or 302 in each of the aforementioned exemplary embodiments by controlling the operation of the computer.

The whole or part of the exemplary embodiment disclosed above can be described as, but not limited to, the following supplementary notes.

(Supplementary Note 1)

An electric device having a casing with an air-inlet and an air-outlet, and a main unit disposed inside the casing, the electric device comprising:

a first temperature sensor for detecting the temperature inside the casing;

a second temperature sensor for detecting the temperature outside the casing;

an electric fan; and a control unit for rotating the electric fan at the time of the low-temperature startup such that the temperature detected by the first temperature sensor is lower than a preset first threshold value, while the temperature detected by the second temperature sensor is higher than the temperature detected by the first temperature sensor.

(Supplementary Note 2)

The electric device according to Supplementary Note 1, wherein the control unit rotates the electric fan at the time of the low-temperature startup in the direction of invoking an airflow from the air-outlet through the inside of the casing toward the air-inlet.

(Supplementary Note 3)

The electric device according to Supplementary Note 2, wherein the second temperature sensor is installed in the vicinity of the air-outlet.

(Supplementary Note 4)

The electric device according to Supplementary Note 1, wherein the second temperature sensor has a third temperature sensor installed in the vicinity of the air-inlet and a fourth temperature sensor installed in the vicinity of the air-outlet; and the control unit selects the temperature sensor detecting a higher temperature at the time of the low-temperature startup between the third temperature sensor and the fourth temperature sensor and, when the temperature detected by the selected temperature sensor is higher than the temperature detected by the first temperature sensor, rotates the electric fan in the direction of invoking an airflow from the air-inlet through the inside of the casing toward the air-outlet if the selected temperature sensor is the third temperature sensor, but rotates the electric fan in the direction of invoking an airflow from the air-outlet through the inside of the casing toward the air-inlet if the selected temperature sensor is the fourth temperature sensor.

(Supplementary Note 5)

The electric device according to Supplementary Note 1, wherein the control unit rotates the electric fan at the time of the low-temperature startup in the direction of invoking an airflow from the air-inlet through the inside of the casing toward the air-outlet.

(Supplementary Note 6)

The electric device according to Supplementary Note 5, wherein the second temperature sensor is installed in the vicinity of the air-inlet.

(Supplementary Note 7)

The electric device according to any of Supplementary Notes 1 to 6, wherein the control unit rotates the electric fan in the direction of invoking an airflow from the air-inlet through the inside of the casing toward the air-outlet after the temperature detected by the first temperature sensor reaches a temperature higher than the first threshold value.

(Supplementary Note 8)

The electric device according to any of Supplementary Notes 1 to 7, wherein the main unit has a CPU; and the control unit makes the CPU operate on a clock with a lower frequency than usual until the temperature detected by the first temperature sensor exceeds the first threshold value.

(Supplementary Note 9)

The electric device according to Supplementary Note 8, wherein the control unit causes the CPU made to operate on the clock with the lower frequency to carry out a self-test.

(Supplementary Note 10)

An activation method to be carried out by an electric device having a casing with an air-inlet and an air-outlet, a main unit disposed inside the casing, a first temperature sensor for detecting the temperature inside the casing, a second temperature sensor for detecting the temperature outside the casing, an electric fan, and a control unit, the activation method comprising:

rotating the electric fan by the control unit at the time of the low-temperature startup such that the temperature detected by the first temperature sensor is lower than a preset first threshold value, while the temperature detected by the second temperature sensor is higher than the temperature detected by the first temperature sensor.

(Supplementary Note 11)

The activation method according to Supplementary Note 10, wherein the control unit rotates the electric fan at the time of the low-temperature startup in the direction of invoking an airflow from the air-outlet through the inside of the casing toward the air-inlet.

(Supplementary Note 12)

12. The activation method according to Supplementary Note 11, wherein the second temperature sensor detects the temperature in the vicinity of the air-outlet.

(Supplementary Note 13)

The activation method according to Supplementary Note 10, wherein the second temperature sensor has a third temperature sensor installed in the vicinity of the air-inlet and a fourth temperature sensor installed in the vicinity of the air-outlet; and the control unit selects the temperature sensor detecting a higher temperature at the time of the low-temperature startup between the third temperature sensor and the fourth temperature sensor and, when the temperature detected by the selected temperature sensor is higher than the temperature detected by the first temperature sensor, rotates the electric fan in the direction of invoking an airflow from the air-inlet through the inside of the casing toward the air-outlet if the selected temperature sensor is the third temperature sensor, but rotates the electric fan in the direction of invoking an airflow from the air-outlet through the inside of the casing toward the air-inlet if the selected temperature sensor is the fourth temperature sensor.

(Supplementary Note 14)

The activation method according to Supplementary Note 10, wherein the control unit rotates the electric fan at the time of the low-temperature startup in the direction of invoking an airflow from the air-inlet through the inside of the casing toward the air-outlet.

(Supplementary Note 15)

The activation method according to Supplementary Note 14, wherein the second temperature sensor detects the temperature in the vicinity of the air-inlet.

(Supplementary Note 16)

The activation method according to any of Supplementary Notes 10 to 15, wherein the control unit rotates the electric fan in the direction of invoking an airflow from the air-inlet through the inside of the casing toward the air-outlet after the temperature detected by the first temperature sensor reaches a temperature higher than the first threshold value.

(Supplementary Note 17)

The activation method according to any of Supplementary Notes 10 to 16, wherein the main unit has a CPU; and the control unit makes the CPU operate on a clock with a lower frequency than usual until the temperature detected by the first temperature sensor exceeds the first threshold value.

(Supplementary Note 18)

The activation method according to Supplementary Note 17, wherein the control unit causes the CPU made to operate on the clock with the lower frequency to carry out a self-test.

(Supplementary Note 19)

An electric device having a casing with an air-inlet and an air-outlet, and a main unit disposed inside the casing, the electric device comprising:

a first temperature sensor for detecting the temperature inside the casing;

a second temperature sensor for detecting the temperature outside the casing; an electric fan; and a control means for rotating the electric fan at the time of the low-temperature startup such that the temperature detected by the first temperature sensor is lower than a preset first threshold value, while the temperature detected by the second temperature sensor is higher than the temperature detected by the first temperature sensor.

(Supplementary Note 20)

A computer-readable medium storing a program comprising instructions for causing a computer of an electric device having a casing with an air-inlet and an air-outlet, a main unit disposed inside the casing, a first temperature sensor for detecting the temperature inside the casing, a second temperature sensor for detecting the temperature outside the casing, an electric fan, and the computer to carry out a process of rotating the electric fan at the time of the low-temperature startup such that the temperature detected by the first temperature sensor is lower than a preset first threshold value, while the temperature detected by the second temperature sensor is higher than the temperature detected by the first temperature sensor.

(Supplementary Note 21)

A computer program comprising instructions which cause a computer of an electric device having a casing with an air-inlet and an air-outlet, a main unit disposed inside the casing, a first temperature sensor for detecting the temperature inside the casing, a second temperature sensor for detecting the temperature outside the casing, an electric fan, and the computer to carry out a process of rotating the electric fan at the time of the low-temperature such that the temperature detected by the first temperature sensor is lower than a preset first threshold value, while the temperature detected by the second temperature sensor is higher than the temperature detected by the first temperature sensor.

The invention claimed is:

1. An electric device having a casing with an air-inlet and an air-outlet, and a central processing unit (CPU) disposed inside the casing, the electric device comprising:

a first temperature sensor for detecting the temperature inside the casing;

a second temperature sensor for detecting the temperature outside the casing;

an electric fan; and a control unit for rotating the electric fan at a time of a low-temperature startup in which the temperature detected by the first temperature sensor is lower than a preset first threshold value, and the temperature detected by the second temperature sensor is higher than the temperature detected by the first temperature sensor, wherein the electric fan, the CPU, and the air-outlet are arranged in the order of the electric fan, the CPU, and the air-outlet;

wherein the second temperature sensor comprises a third temperature sensor installed at the air-inlet and a fourth temperature sensor installed at the air-outlet; and wherein the control unit selects the temperature sensor detecting a higher temperature at the time of the low-temperature startup between the third temperature sensor and the fourth temperature sensor and, when the temperature detected by the selected temperature sensor is higher than the temperature detected by the first temperature sensor, rotates the electric fan in the direction of invoking an airflow from the air-inlet through the inside of the casing toward the air-outlet if the selected temperature sensor is the third temperature sensor, but rotates the electric fan in the direction of invoking an airflow from the air-outlet through the inside of the casing toward the air-inlet if the selected temperature sensor is the fourth temperature sensor.

2. The electric device according to claim 1, wherein the control unit rotates the electric fan at the time of the low-temperature startup in the direction of invoking an airflow from the air-outlet through the inside of the casing toward the air-inlet.

3. The electric device according to claim 2, wherein the second temperature sensor is installed at the air-outlet.

4. The electric device according to claim 1, wherein the control unit rotates the electric fan at the time of the low-temperature startup in the direction of invoking an airflow from the air-inlet through the inside of the casing toward the air-outlet.

5. The electric device according to claim 4, wherein the second temperature sensor is installed at the air-inlet.

6. The electric device according to claim 1, wherein the control unit rotates the electric fan in the direction of invoking an airflow from the air-inlet through the inside of the casing toward the air-outlet after the temperature detected by the first temperature sensor reaches a temperature higher than the first threshold value.

7. The electric device according to claim 1, wherein the the control unit makes the CPU operate on a clock having a lower frequency than usual until the temperature detected by the first temperature sensor exceeds the first threshold value.

8. The electric device according to claim 7, wherein the control unit causes the CPU made to operate on the clock having the lower frequency to carry out a self-test.

9. The electric device according to claim 1, wherein the control unit is housed inside the casing.

10. The electric device according to claim 1, wherein the electric fan is housed inside the casing.

11. The electric device according to claim 1, wherein the central processing unit (CPU) is housed inside the casing and adjacent to the first temperature sensor.

12. The electric device according to claim 1, wherein
the electric device further comprising an electric component;
the electric component is housed inside the casing; and
the electric component, the electric fan, and the CPU are arranged in the order of the electric component, the electric fan, and the CPU.

13. The electric device according to claim 1, wherein
the air-inlet is on the front side of the casing and the air-outlet is on the back side of the casing.

14. An activation method to be carried out by an electric device having a casing with an air-inlet and an air-outlet, a central processing unit (CPU) disposed inside the casing, a first temperature sensor for detecting a temperature inside the casing, a second temperature sensor for detecting a temperature outside the casing, an electric fan, and a control unit, the activation method comprising:

rotating the electric fan by the control unit at a time of a low-temperature startup in which the temperature detected by the first temperature sensor is lower than a preset first threshold value, and the temperature detected by the second temperature sensor is higher than the temperature detected by the first temperature sensor, wherein the electric fan, the CPU, and the air-outlet are arranged in the order of the electric fan, the CPU, and the air-outlet;

wherein the second temperature sensor comprises a third temperature sensor installed at the air-inlet and a fourth temperature sensor installed at the air-outlet; and wherein the control unit selects the temperature sensor detecting a higher temperature at the time of the low-temperature startup between the third temperature sensor and the fourth temperature sensor and, when the temperature detected by the selected temperature sensor is higher than the temperature detected by the first temperature sensor, rotates the electric fan in the direction of invoking an airflow from the air-inlet through the inside of the casing toward the air-outlet if the selected temperature sensor is the third temperature sensor, but rotates the electric fan in the direction of invoking an airflow from the air-outlet through the inside of the casing toward the air-inlet if the selected temperature sensor is the fourth temperature sensor.

15. The activation method according to claim 14, wherein the control unit rotates the electric fan at the time of the low-temperature startup in the direction of invoking an airflow from the air-outlet through the inside of the casing toward the air-inlet.

16. The activation method according to claim 15, wherein the second temperature sensor detects the temperature at the air-outlet.

17. The activation method according to claim 14, wherein the control unit rotates the electric fan at the time of the low-temperature startup in the direction of invoking an airflow from the air-inlet through the inside of the casing toward the air-outlet.

18. The activation method according to claim 17, wherein the second temperature sensor detects the temperature at the air-inlet.

19. The activation method according to claim 14, wherein the control unit rotates the electric fan in the direction of invoking an airflow from the air-inlet through the inside of the casing toward the air-outlet after the temperature detected by the first temperature sensor reaches a temperature higher than the first threshold value.

20. The activation method according to claim 14, wherein the control unit makes the CPU operate on a clock having a lower frequency than usual until the temperature detected by the first temperature sensor exceeds the first threshold value.

21. The activation method according to claim 20, wherein the control unit causes the CPU made to operate on the clock having the lower frequency to carry out a self-test.

22. A non-transitory computer-readable medium storing a program comprising instructions for causing a computer of an electric device having a casing with an air-inlet and an air-outlet, a central processing unit (CPU) disposed inside the casing, a first temperature sensor for detecting a temperature inside the casing, a second temperature sensor for detecting a temperature outside the casing, an electric fan, and the computer, to perform an activation method comprising:

rotating the electric fan at a time of a low-temperature startup such that the temperature detected by the first temperature sensor is lower than a preset first threshold value, while the temperature detected by the second temperature sensor is higher than the temperature detected by the first temperature sensor, wherein the electric fan, the CPU, and the air-outlet are arranged in the order of the electric fan, the CPU, and the air-outlet;

wherein the second temperature sensor comprises a third temperature sensor installed at the air-inlet and a fourth temperature sensor installed at the air-outlet; and wherein the control unit selects the temperature sensor detecting a higher temperature at the time of the low-temperature startup between the third temperature sensor and the fourth temperature sensor and, when the temperature detected by the selected temperature sensor is higher than the temperature detected by the first temperature sensor, rotates the electric fan in the direction of invoking an airflow from the air-inlet through the inside of the casing toward the air-outlet if the selected temperature sensor is the third temperature sensor, but rotates the electric fan in the direction of invoking an airflow from the air-outlet through the inside of the casing toward the air-inlet if the selected temperature sensor is the fourth temperature sensor.

* * * * *